United States Patent [19]

Hatano et al.

[11] Patent Number: 5,576,239
[45] Date of Patent: Nov. 19, 1996

[54] METHOD OF MANUFACTURING SOLID STATE IMAGE SENSING DEVICE

[75] Inventors: Keisuke Hatano; Kazuma Minami, both of Tokyo, Japan

[73] Assignee: NEC Corporation, Tokyo, Japan

[21] Appl. No.: 455,996

[22] Filed: May 31, 1995

[30]   Foreign Application Priority Data

May 31, 1994 [JP] Japan .................... 6-119116

[51] Int. Cl.⁶ .................................... H01L 21/70
[52] U.S. Cl. .................. 437/53; 437/3; 437/4; 437/183; 437/199
[58] Field of Search ............... 437/53, 2, 3, 4, 437/183, 187, 188, 189, 193, 194, 203

[56]   References Cited

U.S. PATENT DOCUMENTS

| | | | |
|---|---|---|---|
| 4,894,701 | 1/1990 | Erhardt et al. | 257/228 |
| 5,254,480 | 10/1993 | Tran | 437/4 |
| 5,366,905 | 11/1994 | Mukai | 437/188 |
| 5,416,344 | 5/1995 | Ishizuya et al. | 257/228 |
| 5,436,458 | 7/1995 | Tran et al. | 250/370.09 |
| 5,443,995 | 8/1995 | Nulman | 437/194 |
| 5,492,852 | 2/1996 | Minami | 437/53 |

FOREIGN PATENT DOCUMENTS 63-53949   3/1988   Japan .

*Primary Examiner*—Kevin Picardat
*Attorney, Agent, or Firm*—Young & Thompson

[57]   ABSTRACT

An aluminum film for covering an interlayer insulating film is formed by sputtering, and is then subjected to a heat treatment at a temperature lower than its melting point to cause a reflow. Then, an opening is formed in the aluminum film, so that a light shielding film is formed in such a way as to cover the step portion with a uniform thickness. Making the light shielding film of a solid state image sensing device thinner permits the opening size of the light shielding film to increase, ensures the effective use of light to improve the sensitivity, and improves the working precision in forming the opening, thus suppressing a variation in the sensitivity of the individual pixels.

8 Claims, 7 Drawing Sheets

6,576,239

METHOD OF MANUFACTURING SOLID STATE IMAGE SENSING DEVICE

BACKGROUND OF THE INVENTION

1. Field of the Invention

The present invention relates to a method of manufacturing a solid state image sensing device, which forms a light shielding film on a semiconductor substrate provided with a photoelectric converting area and a transfer channel for receiving charges from the photoelectric converting area and transferring the charges. More particularly, this invention relates to a method of manufacturing a solid state image sensing device with an improved method of forming a light shielding film.

2. Description of the Related Art

In a solid state image sensing device like a CCD (Charge Coupled Device) image sensor, a plurality of photoelectric converting elements are arranged in a line or two-dimensionally. When an image is projected on those photoelectric converting elements, electric signals proportional to the brightnesses of the image are output from the respective photoelectric converting elements as a result of sensing the image.

FIG. 1 is a plan view showing a unit pixel of an ordinary conventional CCD image sensor, and FIG. 2 is a cross-sectional view of the unit pixel. An N type diffusion layer 2 (photoelectric converting area) is formed on the surface of a P type silicon substrate 1. This P type silicon substrate 1 and the N type diffusion layer 2 constitute a PN photodiode or a photoelectric converting element. Further, a $P^{30}$ type diffusion layer (device isolating area 3) and an N type buried channel 4 are formed on the substrate surface. First transfer electrodes 7-1 and second transfer electrodes 7-2 are alternately arranged, partially overlapping one another, on the N type buried channel 4 via a gate insulating film 6. The first and second transfer electrodes 7-1 and 7-2 are formed of a polysilicon film. An insulating film 8 is formed about 200 nm thick by thermally oxidizing the first transfer electrode 7-1. This insulating film 8 insulates the first and second transfer electrodes 7-1 and 7-2 from each other. The N type buried channel 4, the first transfer electrode 7-1 and the second transfer electrode 7-2 constitute a vertical CCD shift register. The second transfer electrode 7-2 also serves as a shift electrode for reading charges accumulated in the N type diffusion layer 2 and transferring the charges via a transfer channel 5 to the N type buried channel 4. A light shielding film 10 made of aluminum or the like is provided on the first and second transfer electrodes 7-1 and 7-2 via an interlayer insulating film 9. This light shielding film 10 has an opening 11 formed only at the portion above the photoelectric converting area (N type diffusion layer 2), exposing the interlayer insulating film 9 there.

The operation of the conventional solid state image sensing device in this unit pixel section will be described below. A signal charge produced by the photoelectric conversion of incident light 12 is accumulated in the N type diffusion layer 2, and is read out to the N type buried channel 4 via the transfer channel 5 by the shifting operation of the shift electrode. Subsequently, the accumulated signal charges are transferred in the N type buried channel 4 in response to a transfer pulse applied to the first and second transfer electrodes 7-1 and 7-2.

The N type buried channel 4 and the P type silicon substrate 1 have a PN junction, so that when light enters this portion, photoelectric conversion occurs, thus generating unnecessary charges. If the unnecessary charges are mixed with the signal charges read from the N type diffusion layer 2, the accurate image signal cannot be obtained. To prevent this phenomenon, the light shielding film 10 made of aluminum or the like is provided above the first and second transfer electrodes 7-1 and 7-2 via the interlayer insulating film 9. This light shielding film 10 permits light 12 to be incident only on the photoelectric converting area (N type diffusion layer 2) and prevents the light incident to the other areas.

As CCD image sensors are designed to have a greater number of pixels to improve the resolution, the area per pixel becomes smaller and the area of the opening in the light shielding film for receiving the incident light becomes smaller and smaller. To minimize the reduction in sensitivity due to the reduced pixel area, the effective use of light is desired. When an aluminum film is used as the light shielding film 10, the aluminum film should have a thickness of 0.2 μm from the viewpoint of only the light transmittivity. But, pin holes are easily formed in the aluminum film. To prevent the light transmission through the pin holes, the aluminum film should have a thickness of about 0.5 μm.

There is a step formed at the edge portion of the photoelectric converting area (N type diffusion layer 2) by the first and second transfer electrodes 7-1 and 7-2 etc. Supposing that the thickness of the gate insulating film 6 is 80 nm, the thicknesses of the first and second transfer electrodes 7-1 and 7-2 are 250 nm and the thickness of the insulating film 8 of a thermally oxidized polysilicon film, which insulates those transfer electrodes 7-1 and 7-2 from each other, is 200 nm, there is a step of about 0.5 μm at the A—A line portion in FIG. 1. In further consideration of the step coverage of the interlayer insulating film 9 (e.g., a polysilicon oxide film of 300 to 600 nm thick formed by a CVD method), there is a step of around 0.8 μm. Accordingly, the step coverage of the aluminum film is impaired and the flat portion of the aluminum film should have a thickness of 0.8 μm or above. As the light shielding film 10 becomes thicker, light 12a obliquely incident in the vicinity of the opening 11 is reflected by the edge portion of the light shielding film 10 as shown in FIG. 2, thus interfering with the effective usage of light. If the light shielding film 10 is so formed as to completely cover the side wall portion of the transfer electrode in order to obtain a good smear characteristic, the aspect ratio becomes higher because of the necessity of fine processing to provide an opening of 1 μm or below due to the increasing multipixel structure. This makes it very difficult to form such an opening with a high precision. Further, since the diameter of the opening is determined by the thickness of the light shielding film which covers the side wall portion of the transfer electrode, it is difficult to form the opening beyond a certain diameter due to this restriction.

As one way to solve this problem, a metal film having a high melting point has been used conventionally because of its excellent step coverage and its resistance against the formation of pin holes. The film of a refractory metal has a reflectance which is about 50% of that of an aluminum film. When this metal film is used as a light shielding film, it prevents the reflection of light at the end faces and the back (which contacts the interlayer insulating film 9) of the light shielding film and reduces the smear. But, the light transmittivity of the metal film is greater than that of the aluminum film. If a tungsten film is used as the light shielding film, for example, it should have a thickness of 0.4 μm or above in order to prevent the light transmission. Therefore, there is a limit to making the light shielding film thinner.

A known conventional method which improves the step coverage of an aluminum film is disclosed in Unexamined Japanese Patent Publication No. Sho 63-53949. According to this method, after an aluminum film is formed by sputtering, it is subjected to a heat treatment at a temperature of 575° to 720° C. so that the aluminum film is melted to reflow the aluminum film at the step portion.

FIG. 3 is a cross-sectional view showing the metal wiring of a semiconductor device described in the aforementioned Japanese publication. An $SiO_2$ film 102 is formed on a silicon substrate 101. A contact hole 107 is formed in this $SiO_2$ film 102, and an impurity diffusion layer 104 is formed on the surface of the substrate 101 in this contact hole 107. Then, an aluminum film 106 is formed 0.3 μm thick on the surface of the $SiO_2$ film 102 by sputtering. The resultant structure is then subjected to a heat treatment at 700° C. FIG. 3 shows the resultant state. A polysilicon film 103 is buried in the $SiO_2$ film 102 at a protruding step 108. The thickness of the aluminum film 106 above the protruding step 108 is about 0.1 μm. Reference numeral "105" denotes a titanium nitride film having a thickness of about 0.2 μm.

As apparent from the diagram, the aluminum film 106 becomes thinnest at a shoulder 109 of the protruding step 108. The aluminum film is almost completely buried in the contact hole 107 having a diameter of about 1 μm. The thickness of the $SiO_2$ film 102 in the contact hole 107 is about 1 μm.

If this conventional method is used to form the light shielding film of a solid state image sensing device, it is apparent that the aluminum film becomes thin on the transfer electrode and at the shoulder portion (portion 9a in FIG. 2) of the step portion but becomes thicker on the photoelectric converting area. If pin holes hardly exist in the aluminum film after melting process, the aluminum film at the step should have a thickness of at least 0.2 μm. One cannot specifically say how thick the aluminum film should be deposited by sputtering. Assuming that the aluminum film needs to be approximately twice as thick as 0.3 μm, the thickness above the photoelectric converting area becomes 0.6 μm or above, so that the effect of the melting process cannot be expected so much. An aluminum film may be deposited again by sputtering after the melting process. In this case, when an aluminum film of 0.3 μm thick is deposited and melted first, the thickness of the shoulder portion 9a becomes about 0.1 μm, requiring re-deposition of an aluminum film of about 0.3 to 0.4 μm thick. Consequently, the thickness of the aluminum film above the photoelectric converting area becomes equal to or greater than 0.6 to 0.7 μm, the same effect of the melting process as discussed earlier cannot be expected.

SUMMARY OF THE INVENTION

Accordingly, it is an object of the present invention to provide a solid state image sensing device which can ensure the effective use of light, has a high working precision in forming a light shielding film and permits fine openings to be easily formed.

A method of manufacturing a solid state image sensing device according to this invention comprises the steps of: forming a gate insulating film on a semiconductor substrate provided with a photoelectric converting area and a transfer channel for receiving and transferring charges from the photoelectric converting area, and forming a plurality of transfer electrodes on the gate insulating film, the gate insulating film covering a surface of the transfer channel; depositing an interlayer insulating film on an entire surface of a resultant structure; depositing a film of metal or alloy and performing a heat treatment at a temperature lower than a melting point of the metal or alloy film to reflow the metal or alloy film; and forming an opening in the interlayer insulating film above the photoelectric converting area, forming a light shielding film made of the metal or alloy.

The deposition of the metal film may be accomplished by sputtering with high purity aluminum as a target electrode, and the temperature of the heat treatment should be 550° C. to 650° C.

After the metal film is deposited and made to reflow, a refractory metal film having an excellent step coverage may further be formed.

The metal film may be deposited after a low reflectance film having a low light reflectance than the metal film is deposited.

As the heat treatment is performed to reflow the metal film at a temperature lower than the melting point of the metal film, the step coverage is improved without a significant change in shape, and the pin hole density is reduced. It is therefore possible to ensure sufficient light shielding even if the metal film is made thin.

According to this invention, after a metal film of aluminum or the like is formed by sputtering, a reflow is performed at a temperature lower than the melting point of the aluminum film so that the aluminum film can be shaped to have fewer pin holes and a more uniform thickness. This allows a thin light shielding film to be formed above the photoelectric converting area. It is therefore possible to provide a solid state image sensing device which allows the effective utilization of light, ensures a higher working precision in forming the light shielding film, has a less variation in sensitivity and has fine openings.

DETAILED DESCRIPTION OF THE PREFERRED EMBODIMENTS

Figure 4:
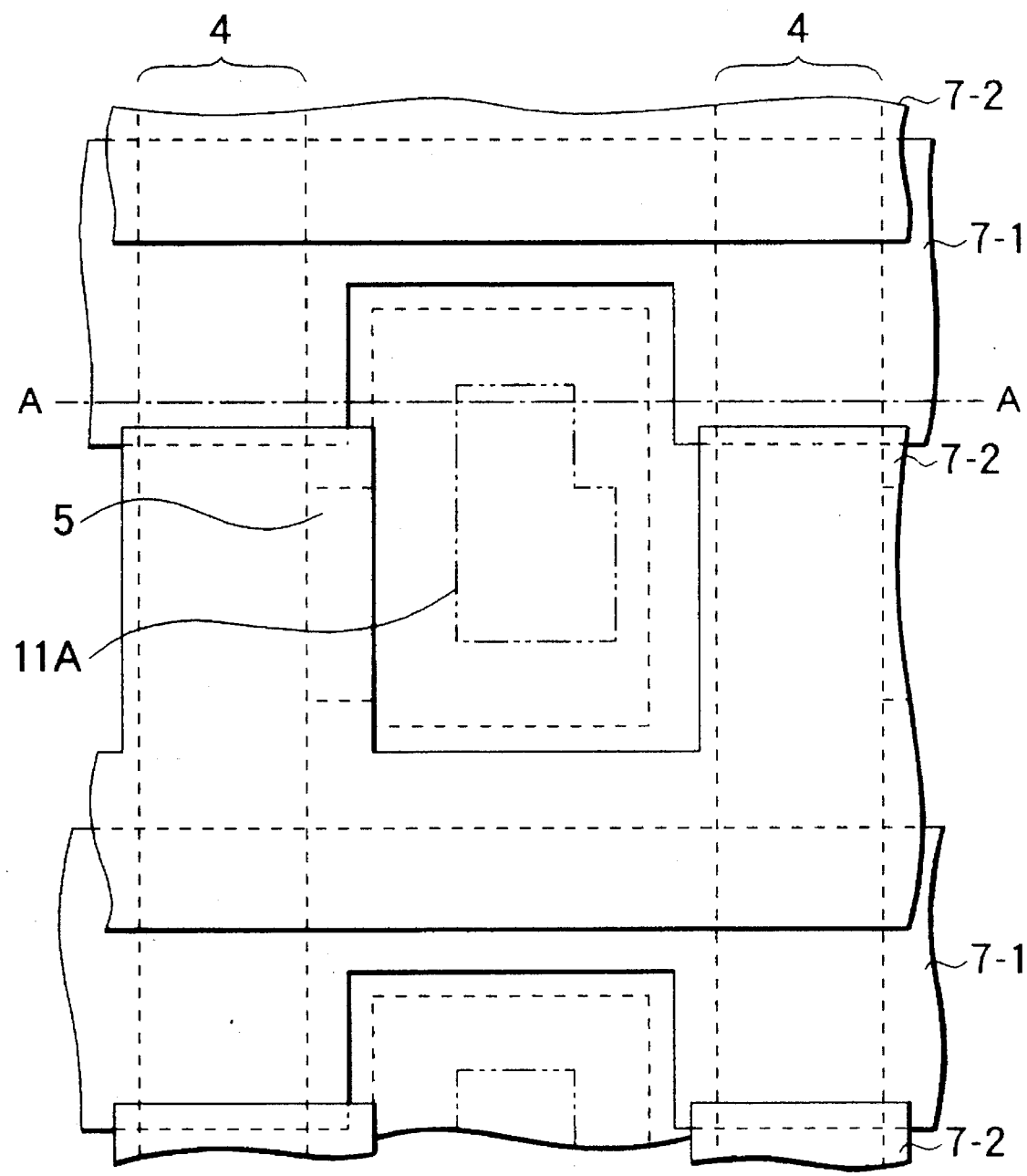
FIG. 4 is a plan view showing a unit pixel of a solid state image sensing device according to a first embodiment of the present invention.
Figure 5:
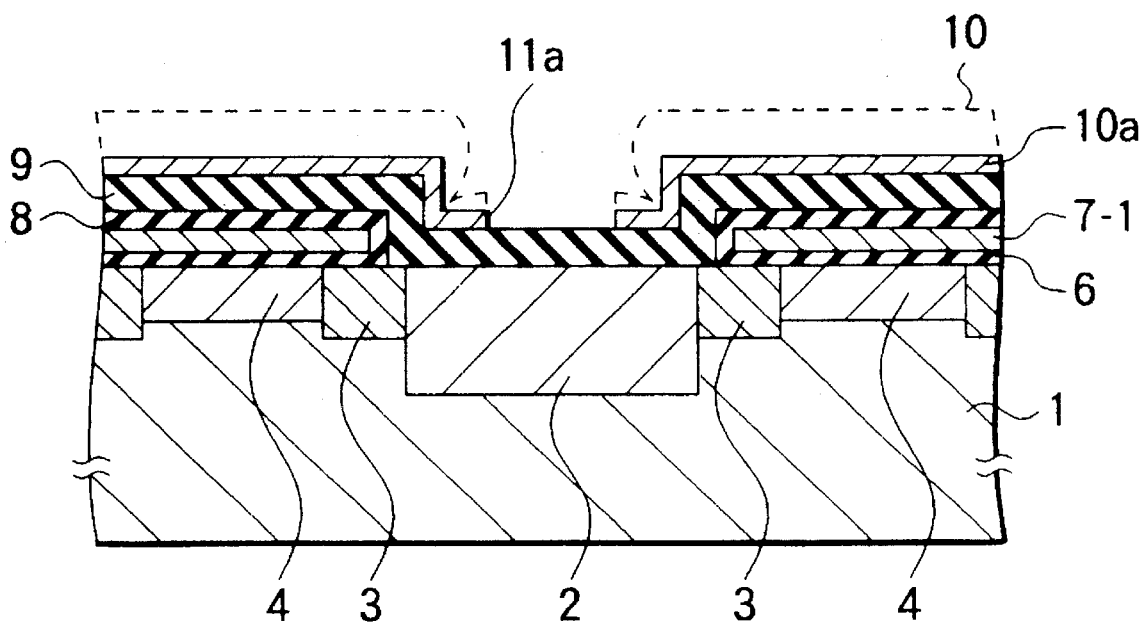
FIG. 5 is a cross-sectional view of this unit pixel.

FIG. 4 is a plan view showing the unit pixel of a solid state image sensing device according to the first embodiment of the present invention, and FIG. 5 is a cross-sectional view along the A—A line in FIG. 4. In FIG. 4, a light shielding film 10a is not illustrated, but an opening 11a is illustrated by a two-dot chain line.

Figure 1:
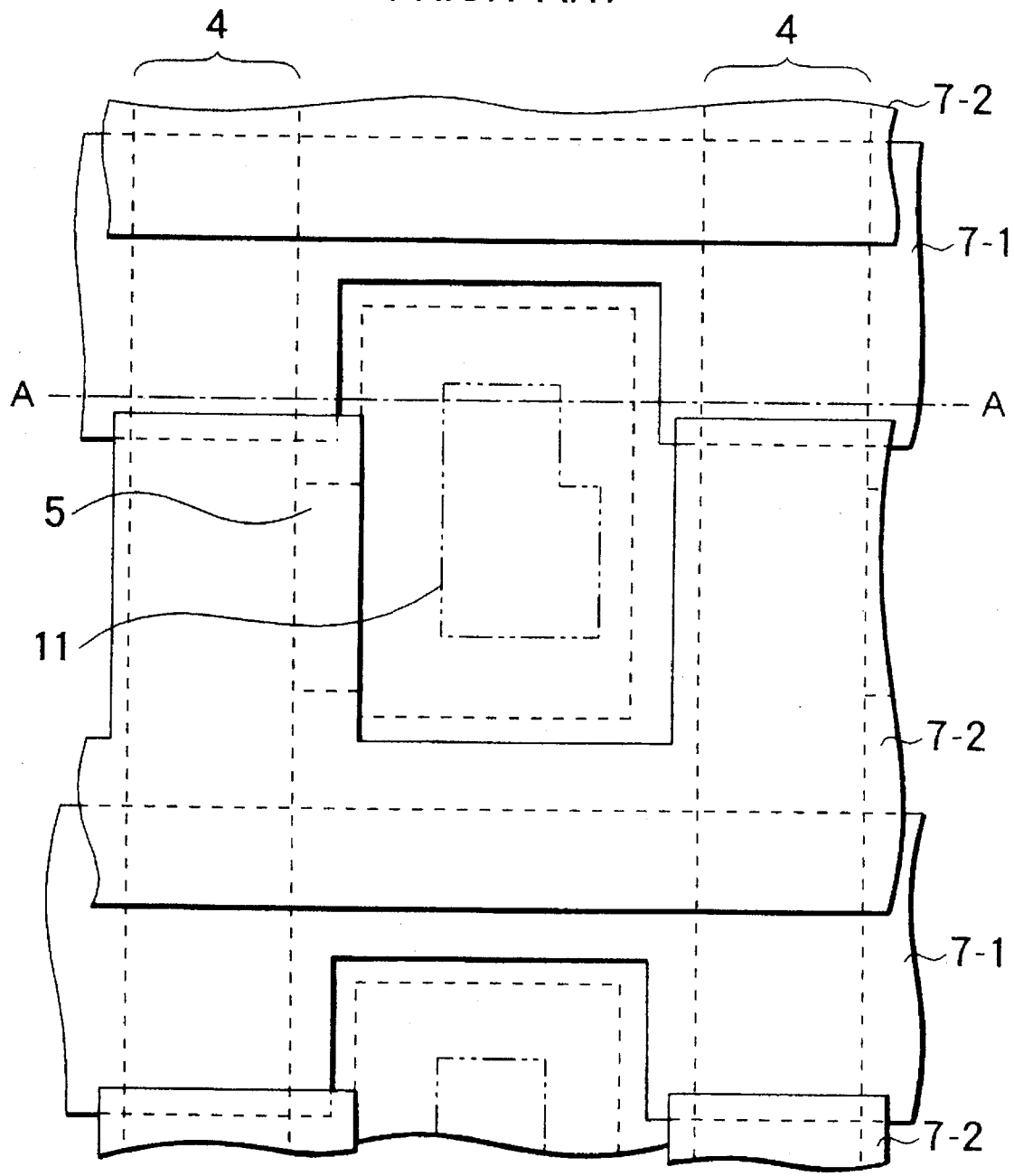
FIG. 1 is a plan view showing a unit pixel of a conventional solid state image sensing device.
Figure 2:
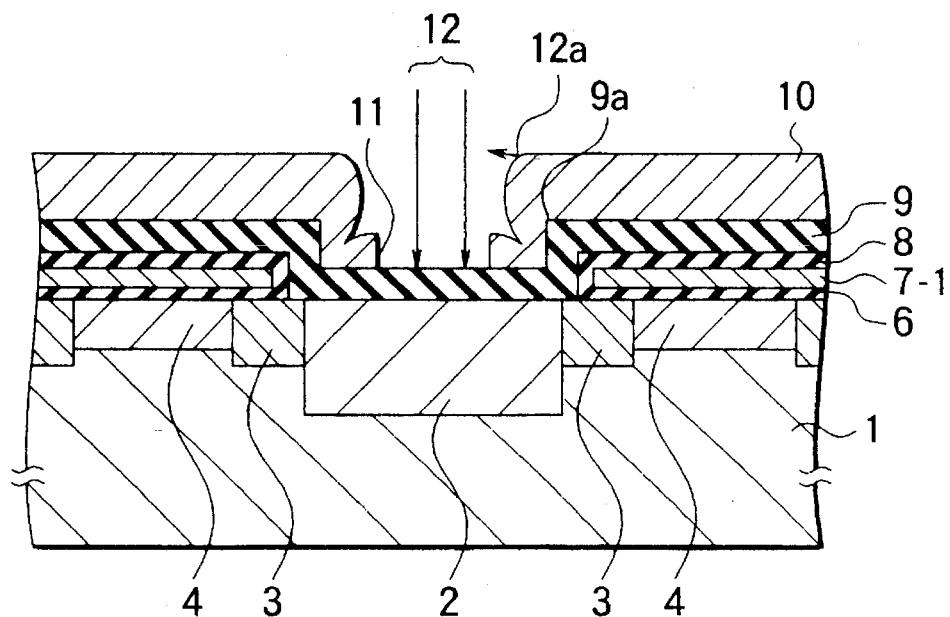
FIG. 2 is a cross-sectional view of the unit pixel.
Figure 3:
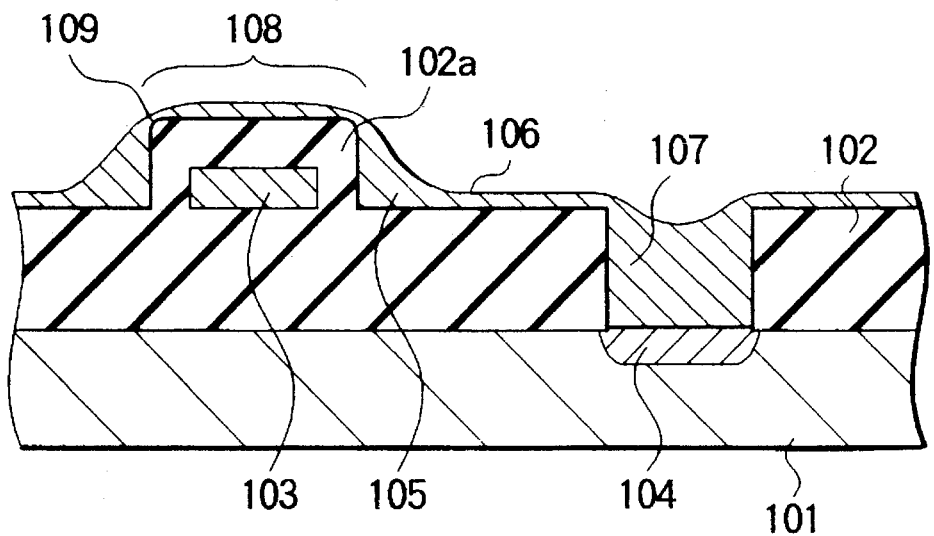
FIG. 3 is a cross-sectional view showing conventional metal wiring.

The difference between this first embodiment and the conventional solid state image sensing device shown in FIGS. 1 and 2 lies in that the light shielding film 10a of the first embodiment has a thickness of 0.2 μm to 0.3 μm, which is thinner than that of the conventional one. For the purpose of comparison, the conventional light shielding film 10 in FIG. 2 is shows by a broken line in FIG. 5.

Figure 6:
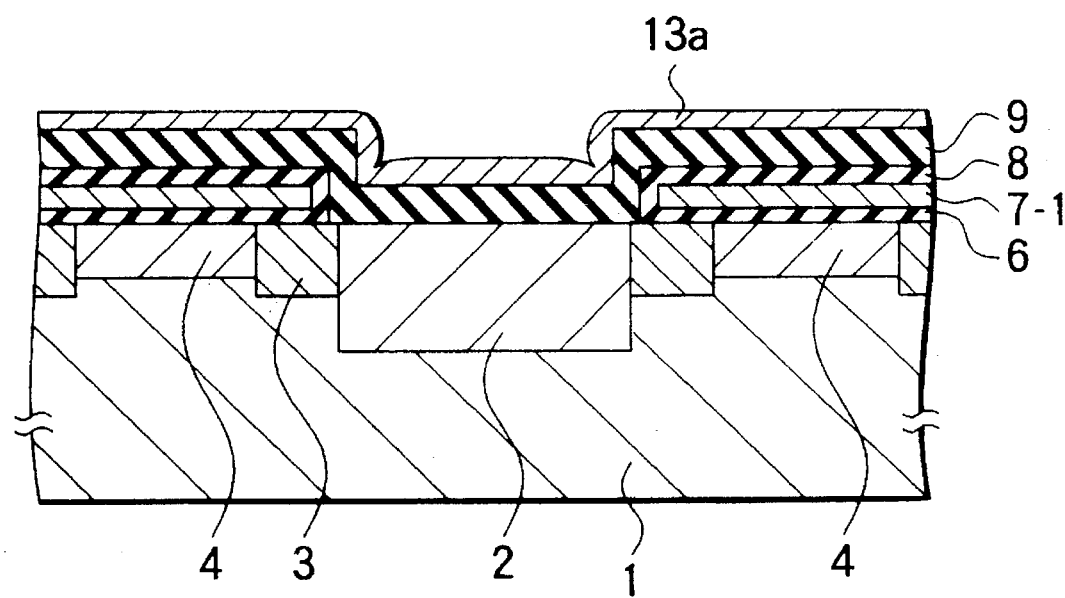
FIG. 6 is a cross-sectional view showing a step in the manufacturing method according to the first embodiment.

The first embodiment of this invention will now be described specifically. First, a P type silicon substrate 1 is prepared on which an N type diffusion layer 2 (photoelectric converting area) and an N type buried channel 4 (transfer channel) for receiving and transferring charges from the N type diffusion layer 2 are provided, as shown in FIGS. 4 and 6. A gate insulating film 6 (silicon oxide film of 80 nm thick) is formed on this substrate 1 in such a way as to cover the surface of the N type buried channel 4. A first transfer electrode (first polysilicon film of 250 nm thick) 7-1 and a second transfer electrode 7-2 (second polysilicon film of 250 nm thick) are formed on this gate insulating film 6, covering this film 6 and slightly overlapping each other. Formed on the first transfer electrode 7-1 is an insulating film 8 of 200 nm thick which is obtained by thermally oxidizing polysilicon that forms the first transfer electrode 7-1.

Next, an interlayer insulating film 9 having a thickness of 300 to 600 nm is formed by a CVD method, and a light shielding film 10a is formed on the interlayer insulating film 9. An opening 11a is formed in the light shielding film 10a above the N type diffusion layer 2.

This light shielding film 10a is formed in the following manner. First, an aluminum film 13a whose flat portion has a thickness of 0.2 μm to 0.3 μm is formed on the interlayer insulating film 9 by sputtering as shown in FIG. 6. In this CVD method, aluminum having a purity of 99.999% by weight (5 nines) is used as the target electrode under the deposition conditions that the temperature of the substrate is 250° C., the argon gas is used and the pressure is 0.266 Pa. As the aluminum film made by sputtering has a poor step coverage, the step portion has a thickness of 0.1 to 0.15 μm at the thinnest portion.

Figure 7:
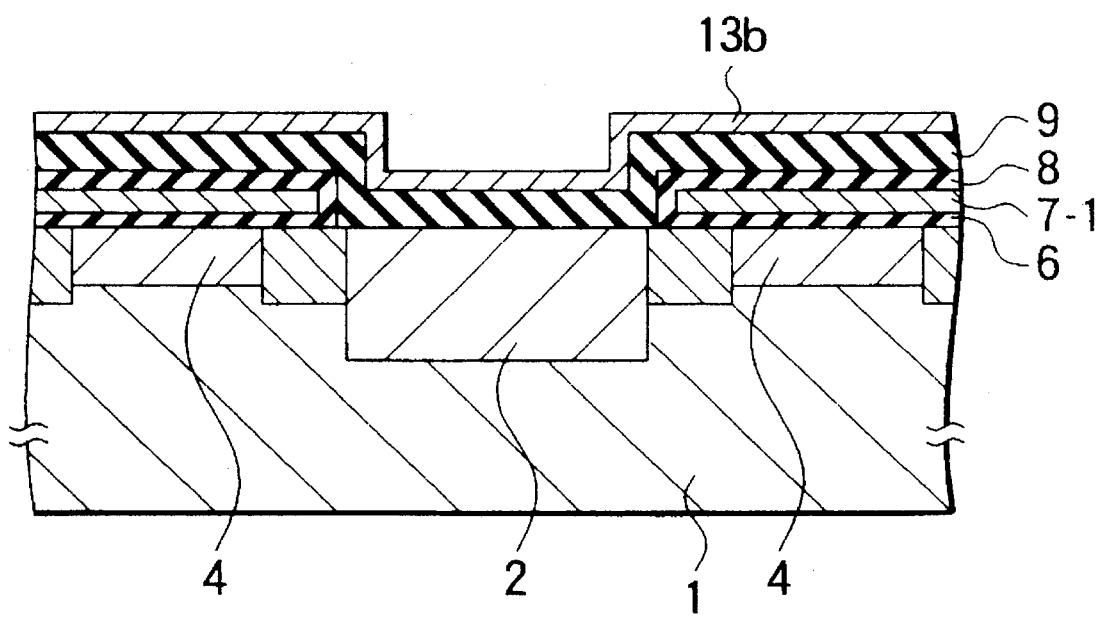
FIG. 7 is a cross-sectional view showing the next step to the one in FIG. 6 in the manufacturing method according to the first embodiment.

Next, a heat treatment is performed at 550° C. to 650° C. at which at least an aluminum film does not melt, reflowing the aluminum film 13a to improve the step coverage, as shown in FIG. 7. Aluminum has a melting point of 660° C. below which the flow progresses due to the softening, improving the shape of the aluminum film 13a. It is desirable that, for example, an infrared lamp be used to heat the aluminum film because the overall heat treatment can be as short as 30 seconds to several minutes. It is also desirable that the heat treatment be carried out under the inactive gas atmosphere of argon gas or the like or the reduction atmosphere from the viewpoint of preventing the oxidation of the aluminum surface. Once the aluminum film after the sputtering is exposed to the atmospheric air, a natural oxide film is formed on the surface of the aluminum film, the flowability in the reflow falls. Therefore, after the aluminum film is deposited by sputtering, the aluminum film is heated in the same apparatus without breaking the vacuum condition so that the intended shape is obtained at a low temperature in a short period of time. According to the experiment conducted by the present inventor, when the heat treatment is executed with an infrared lamp in the inactive gas atmosphere or the like without any exposure to the atmospheric air, the aluminum film 13b having a smooth shape at the step portion and a nearly uniform thickness with a lower pin hole density could be obtained as shown in FIG. 7 at 550° C. to 600° C. in 30 to 120 seconds.

Then, the opening 11a is formed at only the portion above the photoelectric converting area (N type diffusion layer 2) by a photolithography method, thus completing the light shielding film 10a as shown in FIG. 5. The thickness of the light shielding film 10 in the prior art is 0.8 μm or above, whereas the light shielding film 10a can be shaped to have a thickness of 0.2 to 0.3 μm, typically 0.25 μm, in this embodiment. That is, this embodiment can make the light shielding film thinner than the conventional one by ⅓ to ¼. Even if the planar shape of the opening 11a is the same as the conventional opening 11, the possible incident angle of light as viewed from the N type diffusion layer 2 becomes wider, ensuring the effective utilization of light, and the working precision in forming the light shielding film is improved. It is therefore possible to provide a solid state image sensing device having a smaller variation in the sensitivity of each pixel (a variation in the opening 11a).

Figure 8:
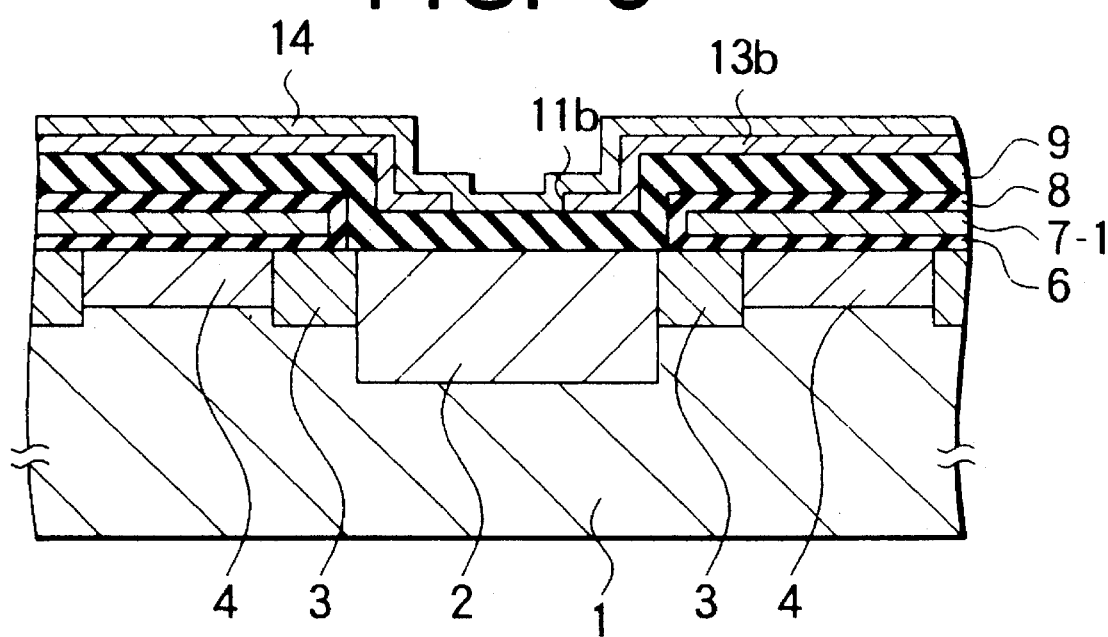
FIG. 8 is a cross-sectional view showing a step in a manufacturing method according to a second embodiment of this invention.

A second embodiment of this invention will now be discussed with reference to FIGS. 8 and 9. An aluminum film 13b is deposited on the entire surface of the interlayer insulating film 9 by sputtering, the reflow is performed, and an opening 11b is formed in the aluminum film 13b above the N type diffusion layer 2, as shown in FIG. 8 as per the first embodiment. Then, a tungsten film 14 having a thickness of 0.1 to 0.2 μm is deposited on the entire surface of the resultant structure by sputtering.

Figure 9:
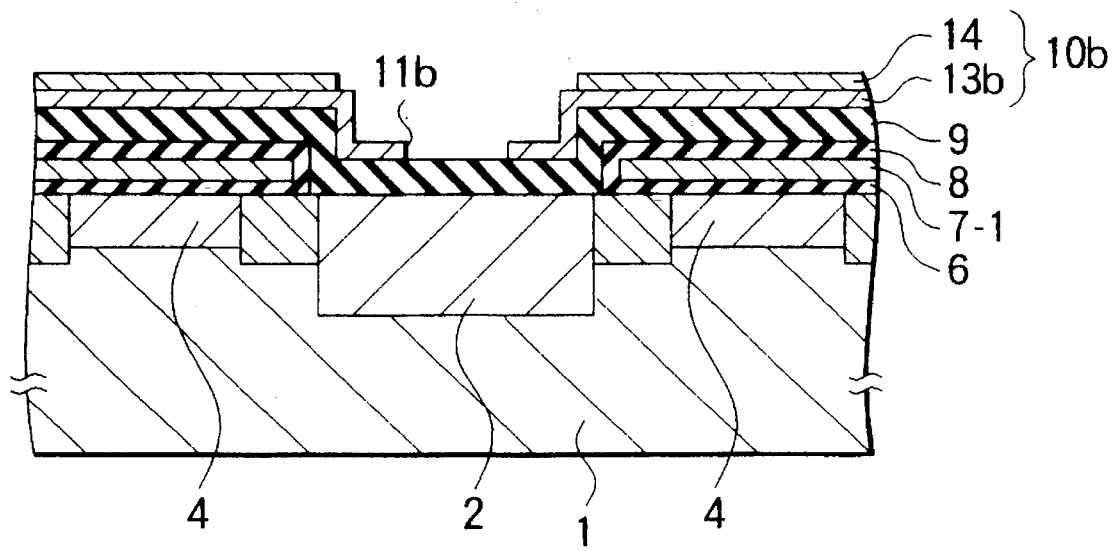
FIG. 9 is a cross-sectional view showing a solid state image sensing device manufactured by the manufacturing method according to the second embodiment.

Next, the tungsten film 14 is patterned by anisotropic etching using a lithography method in such a way that the tungsten film remains on the first and second transfer electrodes 7-1 and 7-2, as shown in FIG. 9. An SF$_6$ gas, if used, can permit tungsten to be selectively etched. The tungsten film 14 after the patterning also serves together with the aluminum film 13b as the light shielding film 10b.

In this embodiment, the light shielding film 10b has a double-layer structure above the transfer electrode 7-1 so that the light shielding film 10b can sufficiently shield light incident on the transfer electrode 7-1 and the thickness of the aluminum film should be set only in consideration of the light shielding above the N type diffusion layer 2. It is therefore possible to make the light shielding film 10b as thin as 0.2 μm which is demanded in view of the transmittivity. The tungsten film 14 may be replaced with a light absorbing substance, such as a metal film of metal having a high melting point like molybdenum, which has an excellent step coverage and can be etched with selectivity with aluminum.

Figure 10:
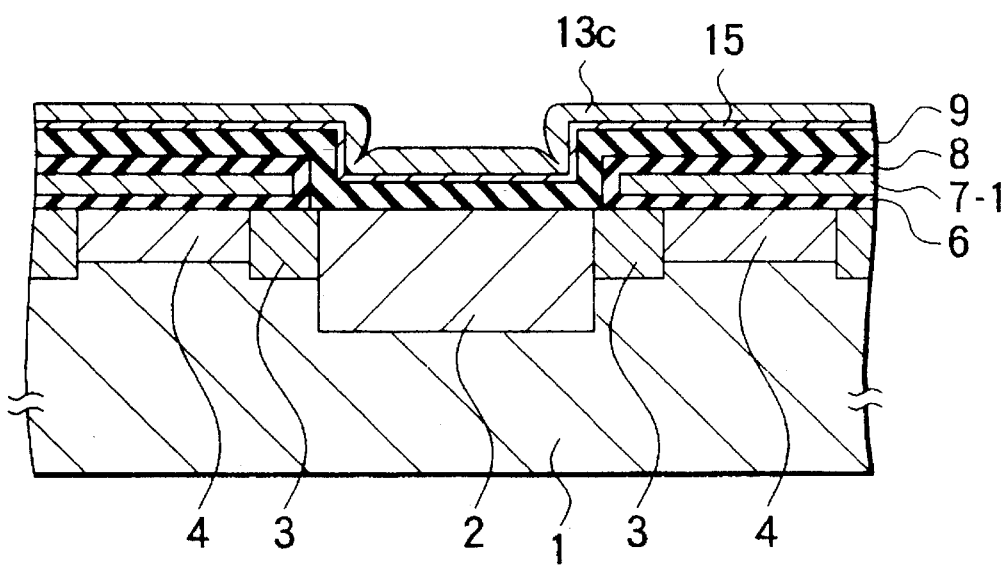
FIG. 10 is a cross-sectional view showing a step in a manufacturing method according to a third embodiment of this invention.

A third embodiment of this invention will now be discussed with reference to FIGS. 10 through 12. First, after the process up to the formation of the interlayer insulating film 9 is performed in the same manner as done in the first embodiment, a tungsten film 15 is formed 0.05 μm to 0.1 μm thick by sputtering, as shown in FIG. 10. Then, an aluminum film 13c is formed by sputtering in such a manner that the flat portion of the aluminum film 13c has a thickness of 0.2 μm to 0.3 μm.

Figure 11:
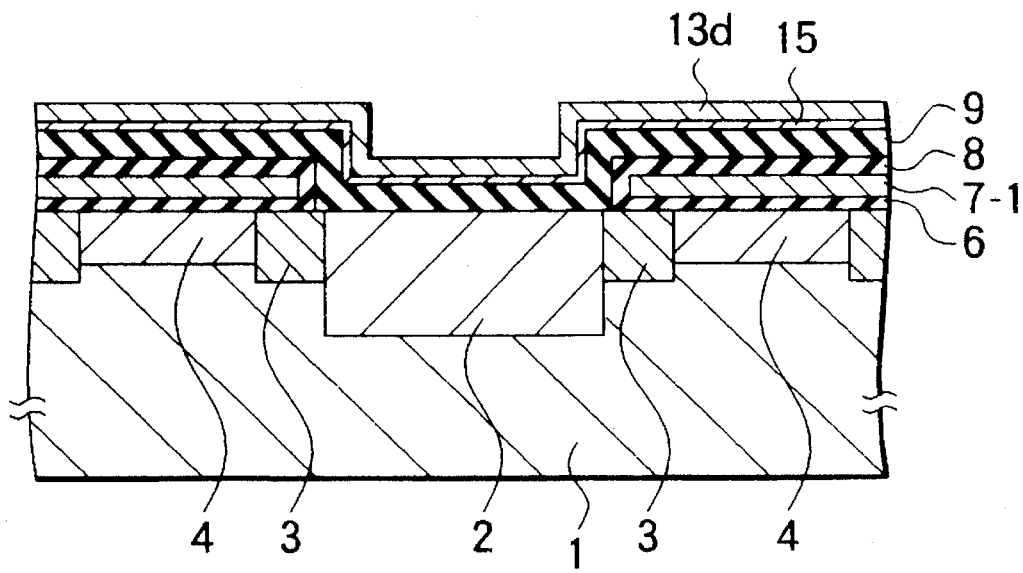
FIG. 11 is a cross-sectional view showing the next step to the one in FIG. 10 in the manufacturing method according to the third embodiment.
Figure 12:
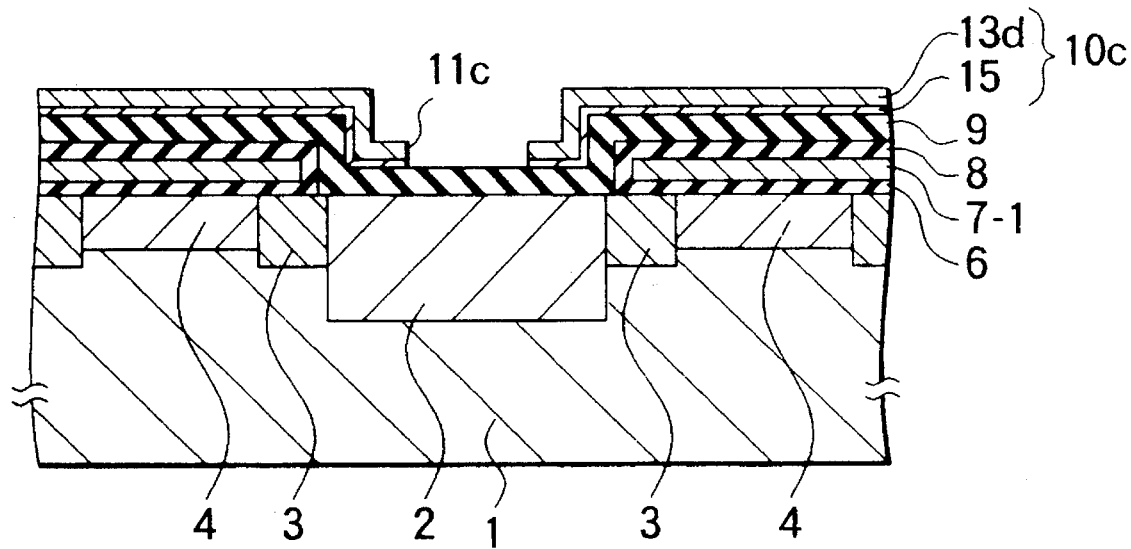
FIG. 12 is a cross-sectional view showing a solid state image sensing device manufactured by the manufacturing method according to the third embodiment.

Next, the reflow of the aluminum film 13c is performed as in the first embodiment, yielding an aluminum film 13d having a smooth shape, as shown in FIG. 11. Thereafter, an opening 11c is formed in the aluminum film 13 and the tungsten film 15 above the N type diffusion layer 2, as shown in FIG. 12. The same mask is used in etching the aluminum film and etching the tungsten film.

In this embodiment, the tungsten film 15 provided below the aluminum film 13d can improve the wettability with the aluminum film and can help accomplish the reflow at a lower temperature and a shorter period of time. As the film serving this purpose, films made of Mo, Ta, Pt, Cu, TiWx (x being 2.5 to 5), and TiNy (y being 0.5 to 1.2), WNz (z being 0.5 to 1.2) may also be used in place of the tungsten film. Since such a film has a lower reflectance than aluminum, it has an advantage of suppressing the occurrence of the smear caused by the multiple reflection of the light, having entered the insulating film 9 from the opening in the light shielding film above the photoelectric converting area (N type diffusion layer 2), between the insulating film 9 and the surface of the silicon substrate.

What is claimed is:

1. A method of manufacturing a solid state image sensing device comprising the steps of:

forming a gate insulating film on a semiconductor substrate provided with a photoelectric converting area and a transfer channel for receiving and transferring charges from said photoelectric converting area, and forming a plurality of transfer electrodes on said gate insulating film, said gate insulating film covering a surface of said transfer channel;

depositing an interlayer insulating film on an entire surface of a resultant structure;

depositing a film of metal or alloy and performing a heat treatment at a temperature lower than a melting point of said metal or alloy film to reflow said metal or alloy film;

forming a refractory metal film after reflowing of said metal or alloy film; and forming openings in said film of metal or alloy and said refractory metal film above said photoelectric converting area, forming a light shielding film made of said metal or alloy and said refractory metal film.

2. The method according to claim 1, wherein said metal or alloy film is deposited after a low reflectance film having a low light reflectance than said metal or alloy film is deposited.

3. The method according to claim 1, wherein said metal or alloy film is an aluminum film deposited by sputtering.

4. The method according to claim 1, wherein said metal or alloy film is an aluminum film deposited by sputtering.

5. The method according to claim 2, wherein said metal or alloy film is an aluminum film deposited by sputtering.

6. The method according to claim 1, wherein said metal or alloy film is an aluminum film deposited by sputtering and said refractory metal film is a tungsten film.

7. The method according to claim 2, wherein said low reflectance film is a refractory metal film or a refractory metal compound film.

8. The method according to claim 7, wherein said refractory metal film is a film selected from a group of a tungsten film, molybdenum film, a tantalum film, a platinum film and a copper film, said refractory metal compound film is a film selected from a group of a titanium-tungsten film, titanium nitride film and a tungsten nitride film, and said metal or alloy film is an aluminum film deposited by sputtering.

* * * * *